US011562878B2

(12) United States Patent
Miyamoto et al.

(10) Patent No.: US 11,562,878 B2
(45) Date of Patent: Jan. 24, 2023

(54) METHOD FOR CONTROLLING OPERATION OF ELECTRON EMISSION SOURCE, ELECTRON BEAM WRITING METHOD, AND ELECTRON BEAM WRITING APPARATUS

(71) Applicant: NuFlare Technology, Inc., Yokohama (JP)

(72) Inventors: Nobuo Miyamoto, Yokohama (JP); Taku Yamada, Ayase (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 17/505,008

(22) Filed: Oct. 19, 2021

(65) Prior Publication Data

US 2022/0157553 A1 May 19, 2022

(30) Foreign Application Priority Data

Nov. 19, 2020 (JP) ............................. JP2020-192571

(51) Int. Cl.
*H01J 37/073* (2006.01)
*H01J 37/304* (2006.01)
*H01J 37/317* (2006.01)

(52) U.S. Cl.
CPC ........ *H01J 37/073* (2013.01); *H01J 37/3045* (2013.01); *H01J 37/3177* (2013.01); *H01J 2237/0435* (2013.01)

(58) Field of Classification Search
CPC .......... H01J 37/06; H01J 37/07; H01J 37/073; H01J 37/243; H01J 37/304; H01J 37/3174;

(Continued)

(56) References Cited

U.S. PATENT DOCUMENTS 6,456,019 B1 * 9/2002 Gordon .................. B82Y 40/00
315/389
2014/0239200 A1 * 8/2014 Miyamoto ............ H01J 37/304
315/307

FOREIGN PATENT DOCUMENTS

CN         1173381 C       10/2004
JP       2009-10078 A       1/2009

(Continued)

OTHER PUBLICATIONS

Combined Taiwanese Office Action and Search Report dated May 25, 2022 in Patent Application No. 110141088 (with English machine translation), 12 pages.

*Primary Examiner* — David E Smith
*Assistant Examiner* — Hsien C Tsai
(74) *Attorney, Agent, or Firm* — Oblon, McClelland, Maier & Neustadt, L.L.P.

(57) ABSTRACT

A method for controlling operation of an electron emission source includes acquiring, while varying an emission current of an electron beam, a characteristic between a surface current of a target object at a position on the surface of the target object irradiated with the electron beam, and the emission current, calculating, based on the characteristic, first gradient values each obtained by dividing the surface current of the target object by the emission current, in a predetermined range of the emission current in the characteristic, calculating a second gradient value by dividing a surface current of the target object by an emission current in a state where the electron beam has been adjusted, and adjusting a cathode temperature to make the second gradient value in the state where the electron beam has been adjusted be in the range of the first gradient values in the predetermined range of the emission current.

10 Claims, 12 Drawing Sheets

(58) Field of Classification Search
CPC .............. H01J 37/3177; H01J 37/3045; H01J 2237/065; H01J 2237/0653; H01J 2237/06308; H01J 2237/435; H01J 2237/30461; H01J 2237/24585
See application file for complete search history.

(56) References Cited

FOREIGN PATENT DOCUMENTS

| | | |
|---|---|---|
| JP | 2010-62374 A | 3/2010 |
| TW | 382735 | 2/2000 |

* cited by examiner

METHOD FOR CONTROLLING OPERATION OF ELECTRON EMISSION SOURCE, ELECTRON BEAM WRITING METHOD, AND ELECTRON BEAM WRITING APPARATUS

CROSS-REFERENCE TO RELATED APPLICATION

This application is based upon and claims the benefit of priority from prior Japanese Patent Application No. 2020-192571 filed on Nov. 19, 2020 in Japan, the entire contents of which are incorporated herein by reference.

BACKGROUND OF THE INVENTION

Field of the Invention

An embodiment of the present invention relates to a method for controlling operations of an electron emission source, an electron beam writing method, and an electron beam writing apparatus, and for example, to a method for controlling operating conditions of an electron gun.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. The electron beam writing technique which intrinsically has excellent resolution is used for writing or "drawing" a mask pattern on a mask blank with electron beams.

For example, as a known example of employing the electron beam writing technique, there is a writing apparatus using multiple beams. Since it is possible for multi-beam writing to apply multiple beams at a time, the writing throughput can be greatly increased in comparison with single electron beam writing. For example, a writing apparatus employing the multi-beam system forms multiple beams by letting portions of an electron beam emitted from an electron gun individually pass through a corresponding one of a plurality of holes in a mask, performs blanking control for respective formed beams, reduces by an optical system beams that were not blocked in the blanking process to reduce a mask image, and deflects the reduced beams by a deflector to irradiate a desired position on a target object or "sample".

As for the electron gun emitting electron beams, the operating temperature of the cathode increases along with achieving higher luminance of the cathode. As a result, the consumption rate of cathode crystal is increased. If a certain quantity of crystal evaporates, desired performance cannot be achieved, thereby ending its life. Then, the cathode needs to be exchanged. However, when exchanging the cathode, the writing apparatus needs to be stopped, resulting in lowering the operating rate of the apparatus. Therefore, it is desirable to make the cathode evaporation rate as low as possible while maintaining a required luminance. In order to achieve this, it is preferable to maintain the cathode temperature as low as possible in the range to acquire a required luminance.

There is conventionally disclosed a technique in which relation between an emission current and a current density at a bias saturation point, and relation between an emission current and a filament power at a bias saturation point are measured, and, referring to these relations, a filament power which provides an emission current in a set current density is calculated (e.g., refer to Japanese Patent Application Laid-open (JP-A) No. 2010-062374).

BRIEF SUMMARY OF THE INVENTION

According to one aspect of the present invention, a method for controlling operation of an electron emission source includes
  emitting an electron beam;
  adjusting the electron beam so that a desired current is obtained on a surface of a target object;
  acquiring, while varying an emission current of the electron beam, a characteristic between a surface current of the target object at a position on the surface of the target object irradiated with the electron beam, and the emission current;
  calculating, based on the characteristic, first gradient values each obtained by dividing the surface current of the target object by the emission current, in a predetermined range of the emission current in the characteristic;
  calculating a second gradient value by dividing a surface current of the target object by an emission current in a state where the electron beam has been adjusted; and
  adjusting a cathode temperature to make the second gradient value in the state where the electron beam has been adjusted be in a range of the first gradient values in the predetermined range of the emission current.

According to another aspect of the present invention, an electron beam writing method includes
  emitting an electron beam;
  adjusting the electron beam so that a desired current is obtained on a surface of a target object;
  acquiring, while varying an emission current of the electron beam, a characteristic between a surface current of the target object at a position on the surface of the target object irradiated with the electron beam, and the emission current;
  calculating, based on the characteristic, first gradient values each obtained by dividing the surface current of the target object by the emission current, in a predetermined range of the emission current in the characteristic;
  calculating a second gradient value by dividing a surface current of the target object by an emission current in a state where the electron beam has been adjusted;
  adjusting a cathode temperature to make the second gradient value in the state where the electron beam has been adjusted be in a range of the first gradient values in the predetermined range of the emission current; and
  writing a pattern on the target object, using an electron beam in a state where the cathode temperature has been adjusted to make the second gradient value be in the range of the first gradient values in the predetermined range of the emission current.

According to yet another aspect of the present invention, an electron beam writing apparatus includes
  an electron emission source configured to emit an electron beam;
  an emission current control circuit configured to control an emission current of the electron beam emitted from the electron emission source;
  an acquisition circuit configured to acquire a characteristic between a surface current of a target object at a position on a surface of the target object irradiated with the electron beam, and the emission current of the electron beam;
  a first gradient value calculation circuit configured to calculate, based on the characteristic, first gradient values each obtained by dividing the surface current of the target object by the emission current in a predetermined range of the emission current in the characteristic;

a second gradient value calculation circuit configured to calculate a second gradient value by dividing a surface current of the target object by an emission current in a state where the electron beam has been adjusted to acquire a desired current on the surface of the target object;

a temperature adjustment circuit configured to adjust a cathode temperature to make the second gradient value in the state where the electron beam has been adjusted be in a range of the first gradient values in the predetermined range of the emission current; and a writing mechanism configured to write a pattern on the target object, using an electron beam in a state where the cathode temperature has been adjusted to make the second gradient value be in the range of the first gradient values in the predetermined range of the emission current.

DETAILED DESCRIPTION OF THE INVENTION

Embodiments below describe a method and apparatus that can make the cathode temperature low while electron beams emitted from an electron emission source maintain required luminance.

Further, Embodiments below describe a configuration using multiple beams as an electron beam. However, it is not limited thereto. A configuration using a single beam may also be acceptable. Further, although a writing apparatus is described below, any other apparatus may also be used as long as it uses electron beams emitted from a thermoelectric emission source. For example, an image acquisition apparatus, an inspection apparatus, and the like may also be used.

First Embodiment

Figure 1:
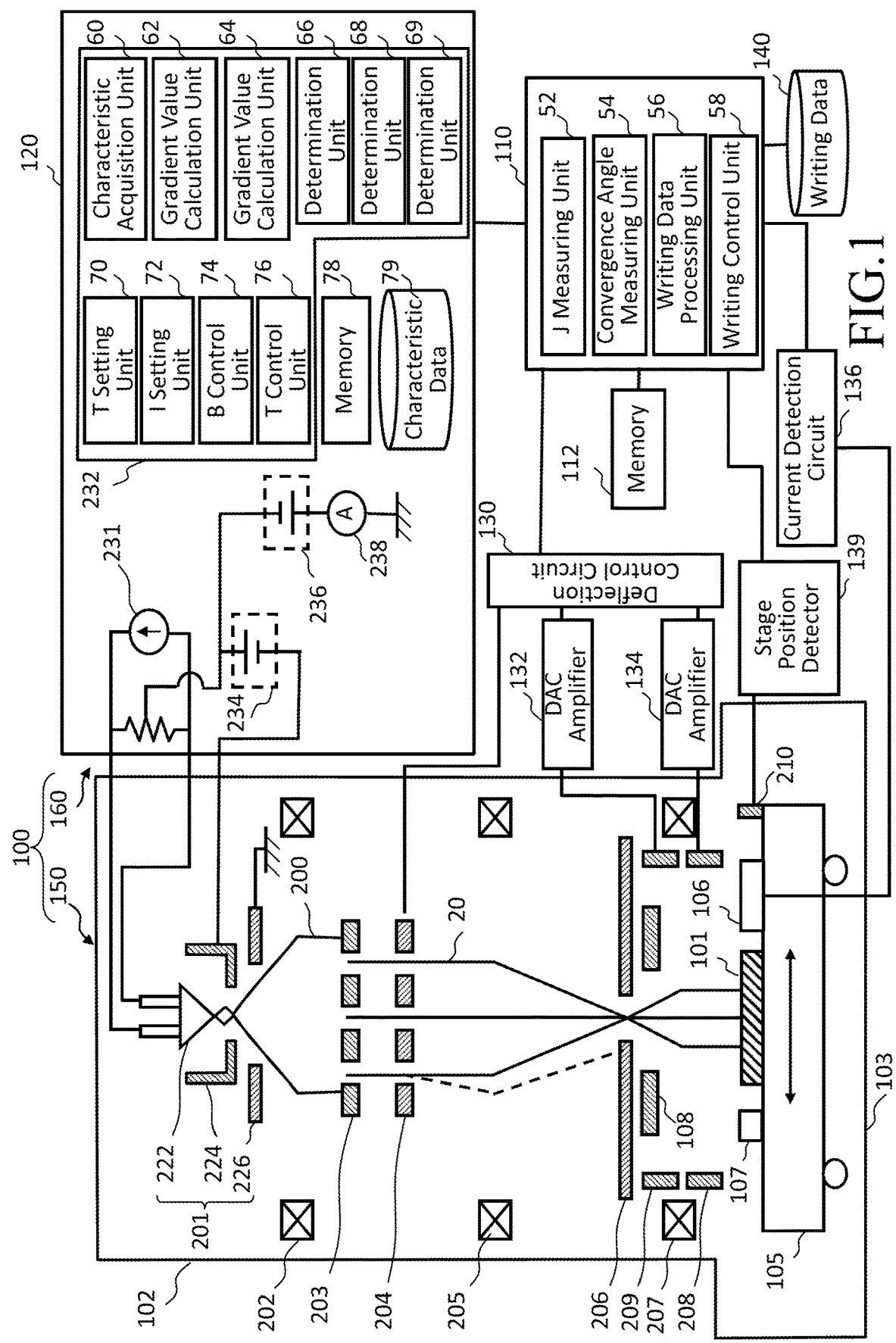
FIG. 1 is a schematic diagram showing a configuration of a writing apparatus according to a first embodiment.

FIG. 1 is a schematic diagram showing a configuration of a writing or "drawing" apparatus 100 according to a first embodiment. As shown in FIG. 1, the writing apparatus 100 includes a writing mechanism 150 and a control system circuit 160. The writing apparatus 100 is an example of a multiple electron beam writing apparatus. The writing mechanism 150 includes an electron beam column 102 (multiple electron beam column) and a writing chamber 103. In the electron beam column 102, there are disposed an electron gun 201, an illumination lens 202, a shaping aperture array substrate 203, a blanking aperture array mechanism 204, a reducing lens 205, a limiting aperture substrate 206, an objective lens 207, a detector 108, a deflector 208, and a deflector 209. In the writing chamber 103, an XY stage 105 is disposed. On the XY stage 105, there is placed a target object or "sample" 101 such as a mask blank on which resist has been applied serving as a writing target substrate when writing is performed. The target object 101 is, for example, an exposure mask used when fabricating semiconductor devices, or a semiconductor substrate (silicon wafer) for fabricating semiconductor devices. Further, on the XY stage 105, a mirror 210 for measuring the position of the XY stage 105, and a Faraday cup 106 are placed. Furthermore, on the XY stage 105, a mark 107 is arranged (formed).

The electron gun 201 (electron beam emission source) includes a cathode 222, a Wehnelt 224 (Wehnelt electrode), and an anode 226 (anode electrode). The anode 226 is grounded.

The control system circuit 160 includes a control computer 110, a memory 112, an electron gun power apparatus 120, a deflection control circuit 130, DAC (digital-analog converter) amplifier units 132 and 134, a current detection circuit 136, a stage position detector 139, and a storage device 140 such as a magnetic disk drive. The control computer 110, the memory 112, the electron gun power apparatus 120, the deflection control circuit 130, the DAC amplifier units 132 and 134, the current detection circuit 136, the stage position detector 139, and the storage device 140 are connected to each other through a bus (not shown). The DAC amplifier units 132 and 134 and the blanking aperture array mechanism 204 are connected to the deflection control circuit 130. Outputs of the DAC amplifier unit 132 are connected to the deflector 209. Outputs of the DAC amplifier unit 134 are connected to the deflector 208. The deflector 208 is composed of at least four electrodes (or "poles"), and each electrode is connected to a DAC amplifier 134 and controlled by the deflection control circuit 130 through the corresponding DAC amplifier 134. The deflector 209 is composed of at least four electrodes (or "poles"), and each electrode is connected to a DAC amplifier unit 132 and controlled by the deflection control circuit 130 through the corresponding DAC amplifier unit 132. The stage position detector 139 emits laser lights to the mirror 210 on the XY stage 105, and receives a reflected light from the mirror 210. The stage position detector 139 measures the position of the XY stage 105, based on the principle of laser interferometry which uses information of the reflected light. Outputs of the Faraday cup 106 are connected to the current detection circuit 136.

In the control computer 110, there are arranged a current density J measuring unit 52, a convergence angle measuring unit 54, a writing data processing unit 56, and a writing control unit 58. Each of the " . . . units" such as the J measuring unit 52, the convergence angle measuring unit 54, the writing data processing unit 56, and the writing control unit 58 includes processing circuitry. As the processing circuitry, for example, an electric circuit, computer, processor, circuit board, quantum circuit, semiconductor device, or the like can be used. Each " . . . unit" may use common processing circuitry (the same processing circuitry), or different processing circuitry (separate processing circuitry). Information input/output to/from the J measuring unit 52, the convergence angle measuring unit 54, the writing data processing unit 56, and the writing control unit 58, and information being operated are stored in the memory 112 each time.

In the electron gun power apparatus 120, there are arranged a control computer 232, a memory 78, a storage device 79 such as a magnetic disk drive, an acceleration voltage power circuit 236, a bias voltage power circuit 234, a filament power supply circuit 231 (filament power supply unit), and an ammeter 238. To the control computer 232, there are connected the memory 78, the storage device 79, the acceleration voltage power circuit 236, the bias voltage power circuit 234, the filament power supply circuit 231, and the ammeter 238 through a bus (not shown).

In the control computer 232, there are arranged a characteristic acquisition unit 60, a gradient value calculation unit 62, a gradient value calculation unit 64, a determination unit 66, a determination unit 68, a determination unit 69, a cathode temperature T setting unit 70, an emission current I setting unit 72, a bias voltage B control unit 74, and a cathode temperature T control unit 76. Each of the " . . . units" such as the characteristic acquisition unit 60, the gradient value calculation unit 62, the gradient value calculation unit 64, the determination unit 66, the determination unit 68, the determination unit 69, the T setting unit 70, the I setting unit 72, the B control unit 74, and the T control unit 76 includes processing circuitry. As the processing circuitry, for example, an electric circuit, computer, processor, circuit board, quantum circuit, semiconductor device, or the like can be used. Each " . . . unit" may use common processing circuitry (the same processing circuitry), or different processing circuitry (separate processing circuitry). Information input/output to/from the characteristic acquisition unit 60, the gradient value calculation unit 62, the gradient value calculation unit 64, the determination unit 66, the determination unit 68, the determination unit 69, the T setting unit 70, the I setting unit 72, the B control unit 74, and the T control unit 76, and information being operated are stored in the memory 78 each time.

The negative electrode (−) side of the acceleration voltage power circuit 236 is connected to both poles of the cathode 222 in the electron beam column 102. The positive electrode (+) side of the acceleration voltage power circuit 236 is grounded through the ammeter 238 connected in series. Further, the negative electrode (−) of the acceleration voltage power circuit 236 branches to be also connected to the positive electrode (+) of the bias voltage power circuit 234. The negative electrode (−) of the bias voltage power circuit 234 is electrically connected to the Wehnelt 224 disposed between the cathode 222 and the anode 226. In other words, the bias voltage power circuit 234 is arranged to be electrically connected between the negative electrode (−) of the acceleration voltage power circuit 236 and the Wehnelt 224. Then, the filament power supply circuit 231 controlled by the T control unit 76 supplies a current between both electrodes of the cathode 222 in order to heat the cathode 222 to a predetermined temperature. In other words, the filament power supply circuit 231 supplies a filament power W to the cathode 222. The filament power W and the cathode temperature T can be defined by a certain relation, and the cathode can be heated to a desired temperature by the filament power W. Thus, the cathode temperature T is controlled by the filament power W. The filament power W is defined by the product of a current flowing between both electrodes of the cathode 222 and a voltage applied to between both electrodes of the cathode 222 by the filament power supply circuit 231. The acceleration voltage power circuit 236 applies an acceleration voltage to between the cathode 222 and the anode 226. The bias voltage power circuit 234 controlled by the B control unit 74 applies a negative bias voltage to the Wehnelt 224.

Writing data is input from the outside of the writing apparatus 100, and stored in the storage device 140. The writing data generally defines information on a plurality of figure patterns to be written. Specifically, it defines a figure code, coordinates, size, etc. of each figure pattern.

FIG. 1 shows a configuration necessary for describing the first embodiment. Other configuration elements generally necessary for the writing apparatus 100 may also be included therein.

Figure 2:
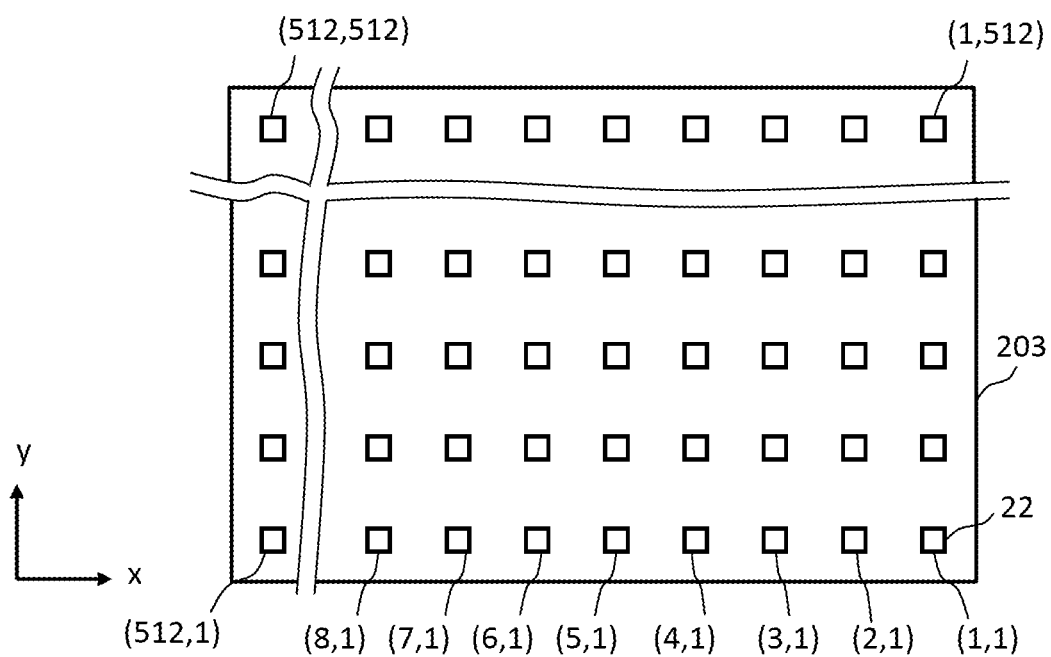
FIG. 2 is a conceptual diagram showing a configuration of a shaping aperture array substrate according to the first embodiment.

FIG. 2 is a conceptual diagram showing a configuration of the shaping aperture array substrate 203 according to the first embodiment. As shown in FIG. 2, holes (openings) 22 of p rows long (length in the y direction) and q columns wide (width in the x direction) (p≥2, q≥2) are formed, like a matrix, at a predetermined arrangement pitch in the shaping aperture array substrate 203. In the case of FIG. 2, for example, holes (openings) 22 of 512×512, that is 512 (rows of holes arrayed in the y direction)×512 (columns of holes arrayed in the x direction), are formed. Each of the holes 22 is rectangular, including square, having the same dimension and shape as each other. Alternatively, each of the holes 22 may be a circle with the same diameter as each other. The shaping aperture array substrate 203 (beam forming mechanism) forms the multiple beams 20. Specifically, the multiple beams 20 are formed by letting portions of the electron beam 200 individually pass through a corresponding one of a plurality of holes 22. The method of arranging the holes 22 is not limited to the case of FIG. 2 where the holes are arranged like a grid in the width and length directions. For example, with respect to the kth and the (k+1)th rows which are arrayed (accumulated) in the length direction (in the y direction) and each of which is in the x direction, each hole in the kth row and each hole in the (k+1)th row may be mutually displaced in the width direction (in the x direction) by a dimension "a". Similarly, with respect to the (k+1)th and the (k+2)th rows which are arrayed (accumulated) in the length direction (in the y direction) and each of which is in the x direction, each hole in the (k+1)th row and each hole in the (k+2)th row may be mutually displaced in the width direction (in the x direction) by a dimension "b".

Figure 3:
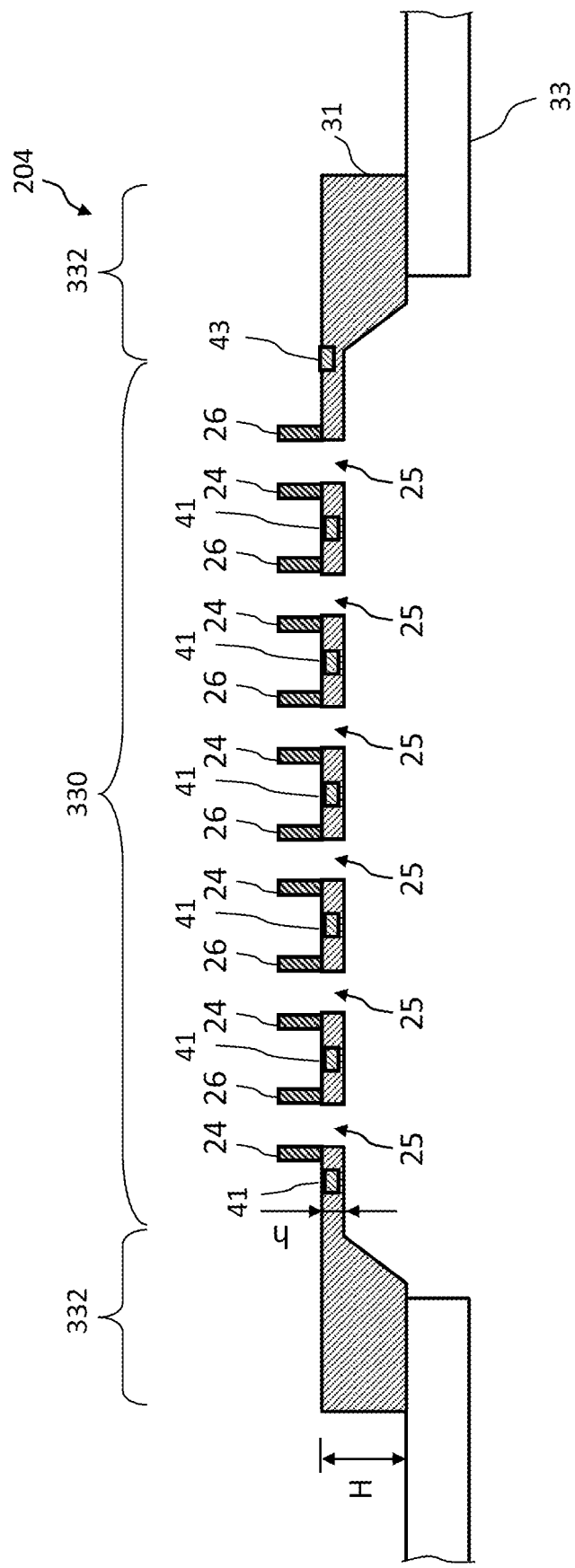
FIG. 3 is a sectional view showing a configuration of a blanking aperture array mechanism according to the first embodiment.

FIG. 3 is a sectional view showing a configuration of a blanking aperture array mechanism 204 according to the first embodiment. With regard to the structure of the blanking aperture array mechanism 204, a semiconductor substrate 31 made of silicon, etc. is placed on a support table 33 as shown in FIG. 3. The central part of the substrate 31 is shaved, for example, from the back side into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of the multiple beams 20 passes are formed at positions each corresponding to each hole 22 in the shaping aperture array substrate 203 shown in FIG. 2. In other words, in the membrane region 330 of the substrate 31, there are formed a plurality of passage holes 25, in an array state, through each of which a corresponding one of the multiple beams 20 passes. Further, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIG. 3, each pair (blanker: blanking deflector) of a control electrode 24 and a counter electrode 26 for blanking deflection is arranged close to a corresponding passage hole 25 in a manner such that the electrodes 24 and 26 are opposite to each other across the passage hole 25 concerned. Further, close to each passage hole 25 in the membrane region 330 of the substrate 31, there is arranged a control circuit 41 (logic circuit) which applies a deflection voltage to the control electrode 24 for the passage hole 25 concerned. The counter electrode 26 for each beam is grounded.

In the control circuit 41, an amplifier (an example of a switching circuit) (not shown), such as a CMOS inverter circuit, is arranged. The output line (OUT) of the amplifier is connected to the control electrode 24. On the other hand, the counter electrode 26 is applied with a ground electric potential. As an input (IN) of the amplifier, either an L (low) potential (e.g., ground potential) lower than a threshold voltage, or an H (high) potential (e.g., 1.5V) higher than or equal to the threshold voltage is applied as a control signal. According to the first embodiment, in a state where an L potential is applied to the input (IN) of the amplifier, the output (OUT) of the amplifier becomes a positive potential (Vdd), and then, a corresponding beam is deflected by an electric field due to a potential difference from the ground potential of the counter electrode 26 so as to be blocked by the limiting aperture substrate 206, and thus it is controlled to be in a beam OFF condition. On the other hand, in a state (active state) where an H potential is applied to the input (IN) of the amplifier, the output (OUT) of the amplifier becomes a ground potential, and therefore, since there is no potential difference from the ground potential of the counter electrode 26, a corresponding beam is not deflected, and controlled to be in a beam ON condition by passing through the limiting aperture substrate 206.

A pair of the control electrode 24 and the counter electrode 26 individually provides blanking deflection of a corresponding beam of the multiple beams 20 by an electric potential switchable by the amplifier which serves as a corresponding switching circuit. Thus, each of a plurality of blankers performs blanking deflection of a corresponding beam in the multiple beams having passed through a plurality of holes 22 (openings) in the shaping aperture array substrate 203.

Next, operations of the writing mechanism 150 of the writing apparatus 100 will be described. The electron beam 200 emitted from the electron gun 201 (electron emission source) illuminates the whole of the shaping aperture array substrate 203 by the illumination lens 202. A plurality of quadrangular holes 22 (openings) are formed in the shaping aperture array substrate 203. The region including all of the plurality of holes 22 is irradiated with the electron beam 200. For example, a plurality of quadrangular electron beams (multiple beams 20) are formed by letting portions of the electron beam 200, which irradiates the positions of the plurality of holes 22, individually pass through a corresponding hole of the plurality of holes 22 of the shaping aperture array substrate 203. The multiple beams 20 individually pass through corresponding blankers (first deflector: individual blanking mechanism) of the blanking aperture array mechanism 204. Each blanker deflects (provides blanking deflection) an electron beam passing therethrough individually.

The multiple beams 20 having passed through the blanking aperture array mechanism 204 are reduced by the reducing lens 205, and go toward the hole in the center of the limiting aperture substrate 206. Then, the electron beam in the multiple beams 20 which was deflected by the blanker of the blanking aperture array mechanism 204 deviates (shifts) from the hole in the center of the limiting substrate 206 and is blocked by the limiting aperture substrate 206. On the other hand, the electron beam which was not deflected by the blanker of the blanking aperture array mechanism 204 passes through the hole in the center of the limiting aperture substrate 206 as shown in FIG. 1. Blanking control is provided by ON/OFF of the individual blanking mechanism so as to control ON/OFF of beams. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams having passed (all of the multiple beams 20 having passed) through the limiting aperture substrate 206 are collectively deflected in the same direction by the deflectors 208 and 209 in order to irradiate respective beam irradiation positions on the target object 101. Ideally, the multiple beams 20 irradiating at a time are aligned at pitches obtained by multiplying the arrangement pitch of a plurality of holes 22 of the shaping aperture array substrate 203 by a desired reduction ratio described above.

As described above, the operating temperature of the cathode 222 of the electron gun 201 which emits the electron beam 200 increases along with achieving higher luminance of the cathode 222. As a result, the consumption rate of cathode crystal is increased. Therefore, while maintaining a required luminance, it is desirable to maintain the consumption rate (evaporation rate) of the cathode 222 as low as possible. In order to achieve this, it is desirable to maintain the cathode temperature T as low as possible within the range to acquire a required luminance.

Figure 4:
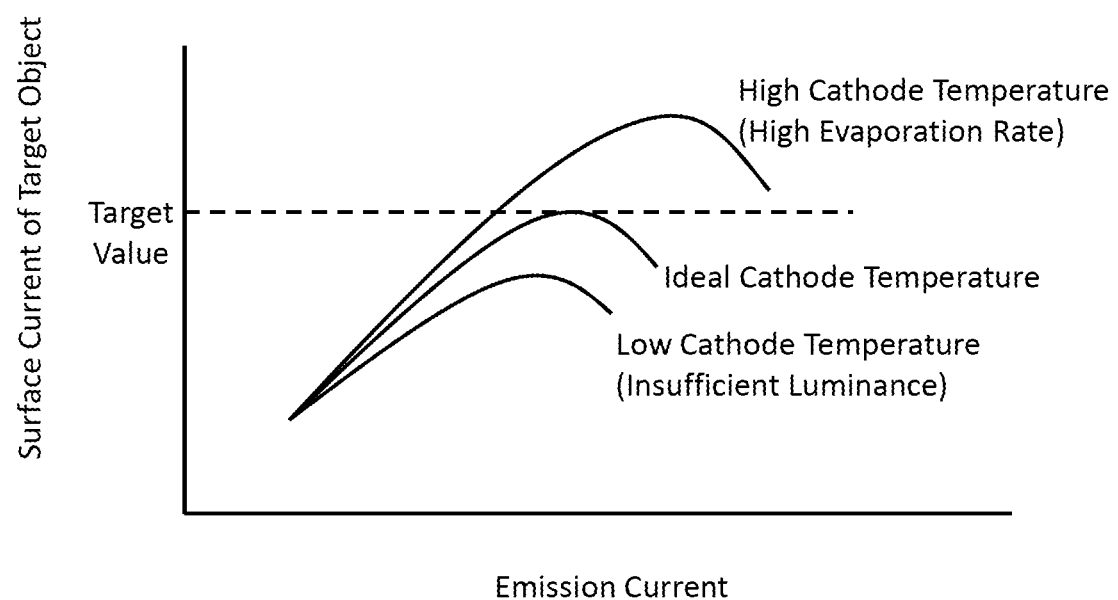
FIG. 4 shows an example of a characteristic between a surface current of a target object and an emission current according to the first embodiment.

FIG. 4 shows an example of a characteristic between a surface current of a target object and an emission current according to the first embodiment. As shown in FIG. 4, a peak exists in the characteristic between the surface current of the target object and the emission current. The peak position moves to larger emission current side along with increase of the cathode temperature. The surface current of the target object is a value corresponding to the current density J being a parameter for obtaining a luminance of the electron beam at the height position of the surface of the target object 101. The electron gun 201 controls the emission current such that the current density J becomes the one based on which a preset luminance can be obtained. In other words, the electron gun 201 controls the emission current such that the surface current of the target object becomes a target value for obtaining a preset luminance. The cathode temperature which gives a characteristic that the surface current of the target object at the peak position is the target value of the surface current of the target object is the lowest cathode temperature to acquire a required luminance. If the cathode temperature is reduced to be lower than this, the characteristic becomes the one which cannot provide a luminance required on the surface of the target object. Conversely, if the cathode temperature is increased to be higher than this, the characteristic becomes the one in which the evaporation rate of the cathode becomes higher along with the increased cathode temperature. Therefore, the cathode temperature that gives a characteristic that the surface current of the target object at the peak position is a target value of the surface current of the target object is an ideal cathode temperature. In a conventional method for adjusting the operating conditions of the electron gun, the electron gun is controlled so that a target value of a surface current of the target object may be obtained in an emission current which is sufficiently smaller than the emission current at the peak position. Therefore, the cathode is used in a state where the cathode temperature is high by using a cathode temperature for obtaining a condition that a target value of a surface current of the target object is obtained in an emission current which is sufficiently smaller than the emission current at the peak position. Then, according to the first embodiment, the cathode temperature is controlled to approach an ideal one. In this situation, the operating mode of the cathode may be in a temperature limited region.

Figure 5:
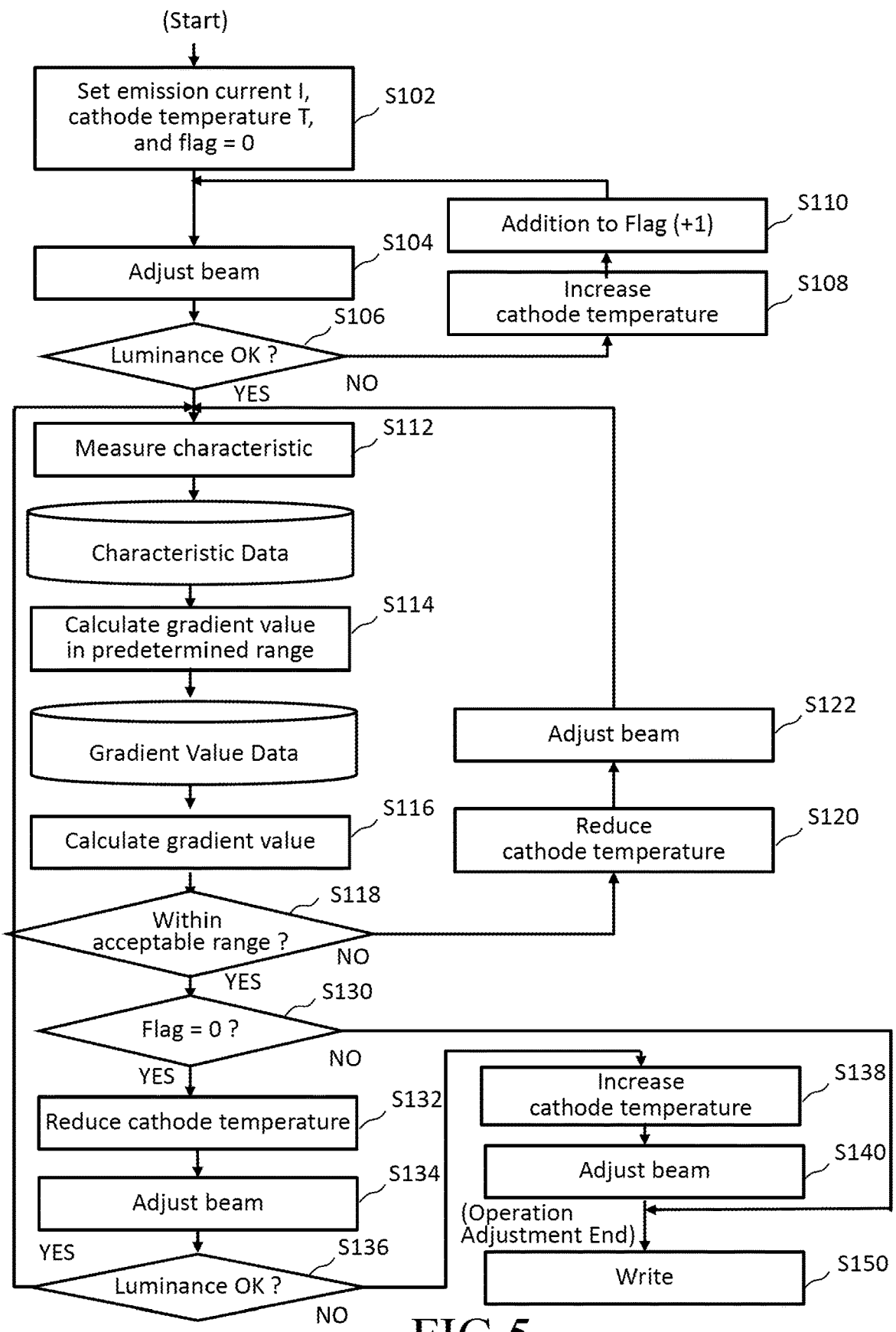
FIG. 5 is a flowchart showing main steps of a writing method according to the first embodiment.

FIG. 5 is a flowchart showing main steps of a writing method according to the first embodiment. In FIG. 5, the writing method of the first embodiment executes a series of steps: an initial value setting step (S102), a beam adjusting step (S104), a determining step (S106), a cathode temperature increasing processing step (S108), a flag adding step (S110), a characteristic measuring step (S112), a gradient value in predetermined range calculating step (S114), a gradient value calculating step (S116), a determining step (S118), a cathode temperature reducing processing step (S120), a beam adjusting step (S122), a determining step (S130), a cathode temperature reducing processing step (S132), a beam adjusting step (S134), a determining step (S136), a cathode temperature increasing processing step (S138), a beam adjusting step (S140), and a writing step (S150).

Further, a method for controlling operations of an electron emission source according to the first embodiment executes, in all the steps shown in FIG. 5, the initial value setting step (S102), the beam adjusting step (S104), the determining step (S106), the cathode temperature increasing processing step (S108), the flag adding step (S110), the characteristic measuring step (S112), the gradient value in predetermined range calculating step (S114), the gradient value calculating step (S116), the determining step (S118), the cathode temperature reducing processing step (S120), the beam adjusting step (S122), the determining step (S130), the cathode temperature reducing processing step (S132), the beam adjusting step (S134), the determining step (S136), the cathode temperature increasing processing step (S138), and the beam adjusting step (S140).

In the initial value setting step (S102), an initial value of the emission current I, an initial value of the cathode temperature T, and flag=0 are set. Specifically, the T setting unit 70 sets an initial value of the cathode temperature T, and flag=0. The I setting unit 72 sets an initial value of the emission current I.

In the beam adjusting step (S104), first, under initial value conditions, the electron beam 200 is emitted from the electron gun 201. Specifically, first, the acceleration voltage power circuit 236 applies a preset acceleration voltage between the cathode 222 and the anode 226. The filament power supply circuit 231 controlled by the T control unit 76 supplies, to the cathode 222, a filament power W corresponding to the initial value of the cathode temperature T. The cathode temperature T is determined by the filament power W. Therefore, in the control system, the cathode temperature T is controlled by the filament power W. In such a state, the bias voltage power circuit 234 controlled by the B control unit 74 adjusts a negative bias voltage to be applied to the Wehnelt 224 such that the current value detected by the ammeter 238 becomes the initial value of the emission current I. Thereby, the electron beam 200 under initial value conditions is emitted from the electron gun 201.

Next, the electron beam 200 emitted from the electron gun 201 at a set cathode temperature is adjusted such that the electron beam 200 satisfies predetermined conditions. According to the first embodiment, the electron beam is adjusted so that a desired current may be acquired on the surface of the target object. Specifically, the electron beam 200 is adjusted so that a preset luminance may be acquired on the surface of the target object. The luminance on the surface of the target object is defined by the current density J and the convergence angle θ. Therefore, acquiring a preset luminance can be achieved by adjusting the current density J to be in an acceptable range for the current density, and adjusting the convergence angle to be in an acceptable range for the convergence angle. Then, while varying the emission current I, the current density J and the convergence angle θ are measured by each emission current I. Then, the emission current I is adjusted to make both the current density J and the convergence angle θ be in their acceptable ranges. The emission current I can be changed by adjusting a bias voltage by the bias voltage power circuit 234 controlled by the B control unit 74. Thus, the B control unit 74 is an example of the emission current control unit.

First, the XY stage 105 is moved to the position where the multiple beams 20 can be incident on the Faraday cup 106. Then, the Faraday cup 106 detects the current value of the multiple beams 20 formed from the electron beam 200 emitted from the electron gun 201, and having reached the surface of the target object. The Faraday cup 106 may detect the current value of the entire multiple beams 20 which enter it simultaneously, or may detect the current value of each beam array group obtained by dividing the multiple beams 20 into a plurality of beam array groups. The detected current value is output to the current detection circuit 136, and after analog signals are converted into digital signals, is output to the J measuring unit 52. The current density J measuring unit 52 can measure the current density J by dividing the input current value by the total value of opening areas of the holes 22 for beams which have been measured in the plurality of holes 22 in the shaping aperture array substrate 203.

The convergence angle of each of the multiple beams 20 can be acquired by measuring the beam size while varying the lens value of the objective lens 207.

Figure 6:
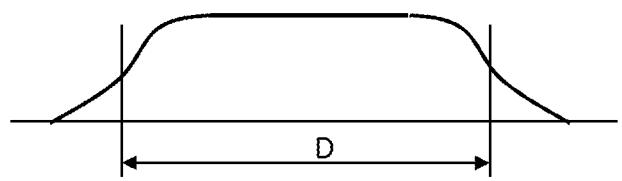
FIG. 6 shows an example of a beam profile according to the first embodiment.

FIG. 6 shows an example of a beam profile according to the first embodiment. A beam profile can be obtained by scanning the mark 107 with the multiple beams 20, and detecting a reflected electron by the detector 108. The mark 107 may be scanned by deflecting the multiple beams 20 by the deflector 208 (or deflector 209). An output of the detector 108 is output to the convergence angle measuring unit 54 through a detection circuit or (not shown). Further, a lens value (or focal distance) of the objective lens 207 is output to the convergence angle measuring unit 54 from a lens control circuit (not shown).

Figure 7:
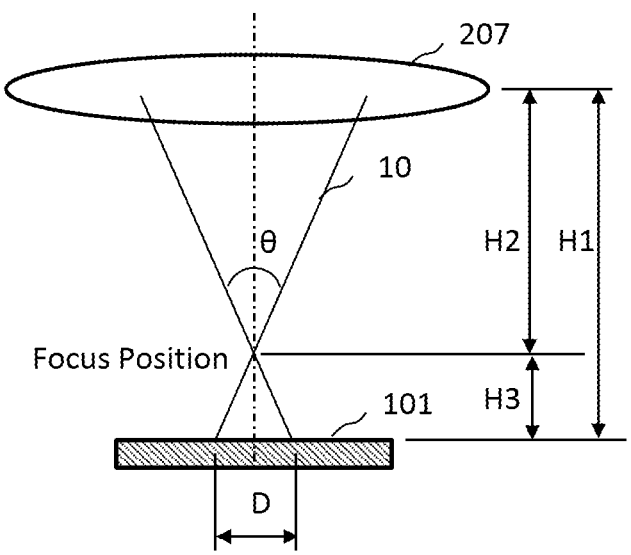
FIG. 7 shows a relation of a convergence angle, a beam size, and a distance to a focus position according to the first embodiment.

FIG. 7 shows a relation of a convergence angle, a beam size, and a distance to a focus position according to the first embodiment. A distance H1 from the objective lens 207 to the surface of the target object 101 is uniquely determined based on the apparatus structure. A distance H2 from the lens main plane (e.g., center height position) of the objective lens 207 to the focus position corresponds to the lens value of the objective lens 207. Thus, a distance H3 (=H1−H2) from the focus position to the surface of the target object can be obtained. The convergence angle measuring unit 54 can measure the convergence angle θ by calculating it by using the distance H3 from the focus position to the surface of the target object and a beam size D. For example, it can be obtained as follows: Convergence angle $\theta = 2 \tan^{-1}(D/(2 \times H3))$ In the determining step (S106), the determination unit 66 determines whether a preset luminance can be obtained at a set cathode temperature. Specifically, the determination unit 66 determines whether the emission current I has been adjusted to obtain the current density J and the convergence angle θ which give a preset luminance at a set cathode temperature. If the determination unit 66 determines that the emission current I cannot be adjusted, since the cathode temperature is too low, it proceeds to the cathode temperature increasing processing step (S108). If the determination unit 66 determines that the emission current I has been adjusted, there is a case where the cathode temperature is too high, it proceeds to the characteristic measuring step (S112).

In the cathode temperature increasing processing step (S108), the T control unit 76 controls the filament power supply circuit 231 to increase the cathode temperature T by one step.

The filament power supply circuit 231 supplies a filament power W for increasing the cathode temperature T by one step. The change range (width) per step of the cathode temperature T may be an optional value. For example, it is preferable to set the change range of the cathode temperature T in the range between 5 degrees C. and 50 degrees C. For example, it is set to be 10 degrees C.

In the flag adding step (S110), the T control unit 76 adds 1 to the flag. The flag is preferably defined as attribute data of the cathode temperature T, but it is not limited thereto. It may be defined as independent data. Since the initial value of the flag is zero if there is a flag whose value is not zero, it indicates that the initial value of the cathode temperature T is too low. That is, the cathode temperature T is adjusted to be high from low.

Then, it returns to the beam adjusting step (S104). The steps from the beam adjusting step (S104) to the flag adding step (S110) are repeated until it is determined in the determining step (S106) that a preset luminance can be obtained at a set cathode temperature. Thereby, the insufficiency of the cathode temperature can be resolved.

In the characteristic measuring step (S112), the characteristic acquisition unit 60 acquires, while changing the emission current of an electron beam, a characteristic between the surface current of the target object at the position irradiated with an electron beam and the emission current. In other words, the characteristic between the surface current of the target object and the emission current at the set cathode temperature is acquired. The value of the surface current of the target object can be obtained as a current value of the multiple beams 20 detected by the Faraday cup 106. The value of the emission current can be obtained as a current value detected by the ammeter 238. Thereby, data of a characteristic graph as shown in FIG. 4 can be obtained. The obtained characteristic data is stored in the storage device 79.

In the gradient value in predetermined range calculating step (S114), the gradient value calculation unit 62 (first gradient value calculation unit) calculates, based on the characteristic, gradient values each obtained by dividing the surface current of the target object by the emission current, in a setting range (predetermined range) of the emission current in the characteristic.

Figure 8A:
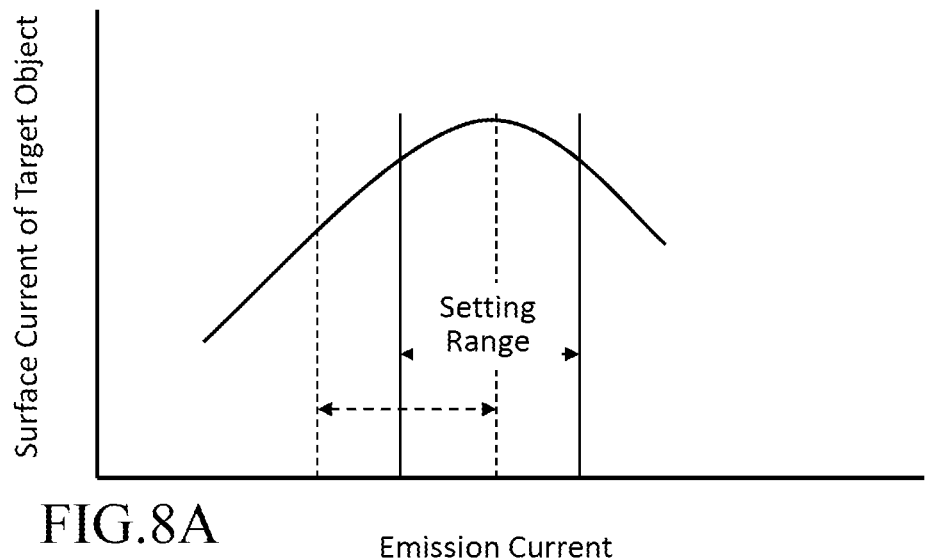
FIGS. 8A and 8B show examples of a characteristic graph and a gradient value according to the first embodiment.
Figure 8B:
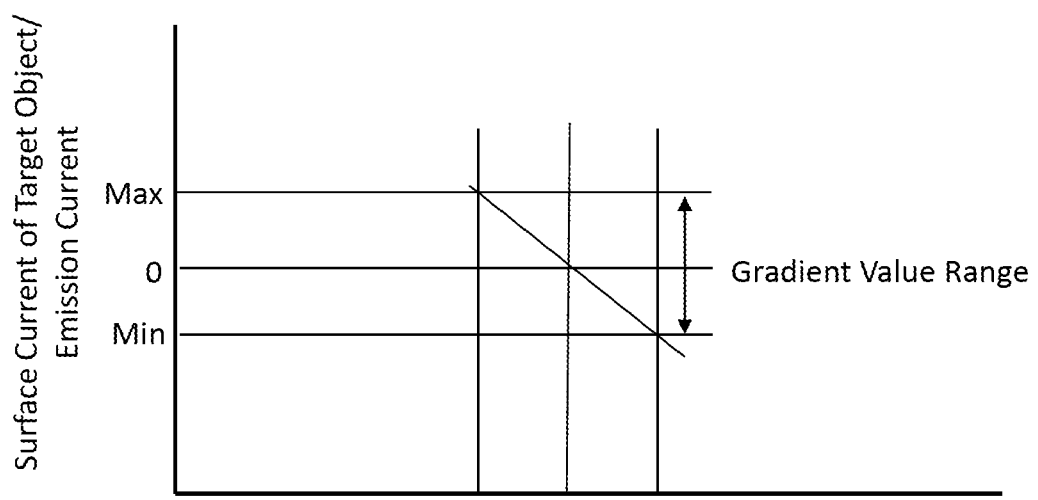

FIGS. 8A and 8B show examples of a characteristic graph and a gradient value according to the first embodiment. FIG. 8A shows a portion of a graph of characteristic between the surface current of a target object and the emission current. In the example of FIG. 8A, the range including the peak position is shown as a setting range (solid line) in the characteristic graph. For example, an emission current range centering the emission current at the peak position and including ±several percent to ±several tens percent (e.g., ±20 percent) of the emission current at the peak position is shown as a setting range. However, the setting range is not limited thereto. For example, it is also preferable to set the range whose upper limit is the emission current at the peak position and lower limit is the emission current reduced from the emission current at the peak position by several percent to several tens percent (e.g., 40 percent) is set as a setting range (dotted line). Alternatively, it is also preferable to set the range whose upper limit is the emission current a little smaller than the emission current at the peak position, and lower limit is the emission current reduced from the emission current at the peak position by several percent to several tens percent (e.g., 40 percent).

FIG. 8B shows as an example of a gradient value. In FIG. 8B, the ordinate axis represents a differential value obtained by dividing a surface current of a target object by an emission current, and the abscissa axis represents an emission current. The example of FIG. 8B shows a gradient value (differential value) of the characteristic graph obtained by dividing the surface current of the target object by the emission current in the setting range (solid line) of FIG. 8A. As shown in FIG. 8B, with respect to the setting range of FIG. 8A, the positive gradient of the rise of the characteristic graph decreases towards the peak, it becomes zero at the peak position, and it falls as a negative gradient after the peak position. Therefore, in the example of FIG. 8B, a gradient value is obtained where the gradient value at the lower limit of the emission current in the setting range is the maximum value (max), and the gradient value at the upper limit of the emission current in the setting range is the minimum value (min). Data of the calculated gradient values is stored in the storage device 79.

In the gradient value calculating step (S116), the gradient value calculation unit 64 (second gradient value calculation unit) calculates a gradient value by dividing the surface current of the target object by the emission current, in a state where the electron beam 200 has been adjusted. Specifically, the gradient value calculation unit 64 calculates a gradient value by dividing the surface current of the target object by the emission current, in a state where the electron beam 200 has been adjusted to acquire a preset luminance at the set cathode temperature. Then, after acquiring the characteristic described above, and adjusting the emission current to have an emission current value determined in the determining step (S106) that based on this emission current a preset luminance can be obtained at the set cathode temperature, the gradient value (differential value) in this state is calculated.

Next, the T control unit 76 (temperature adjustment unit) adjusts the cathode temperature so that the gradient value in the state where the electron beam has been adjusted may be within a range of the gradient values in the characteristic setting range of the emission current. In other words, the T control unit 76 adjusts the cathode temperature so that the gradient value may be within a range of the gradient values in the characteristic setting range of the emission current. It will be specifically described below.

In the determining step (S118), the determination unit 68 determines whether the gradient value in the state where the beam has been adjusted to acquire a preset luminance is in the range of the gradient values in the characteristic setting range of the emission current.

Figure 9:
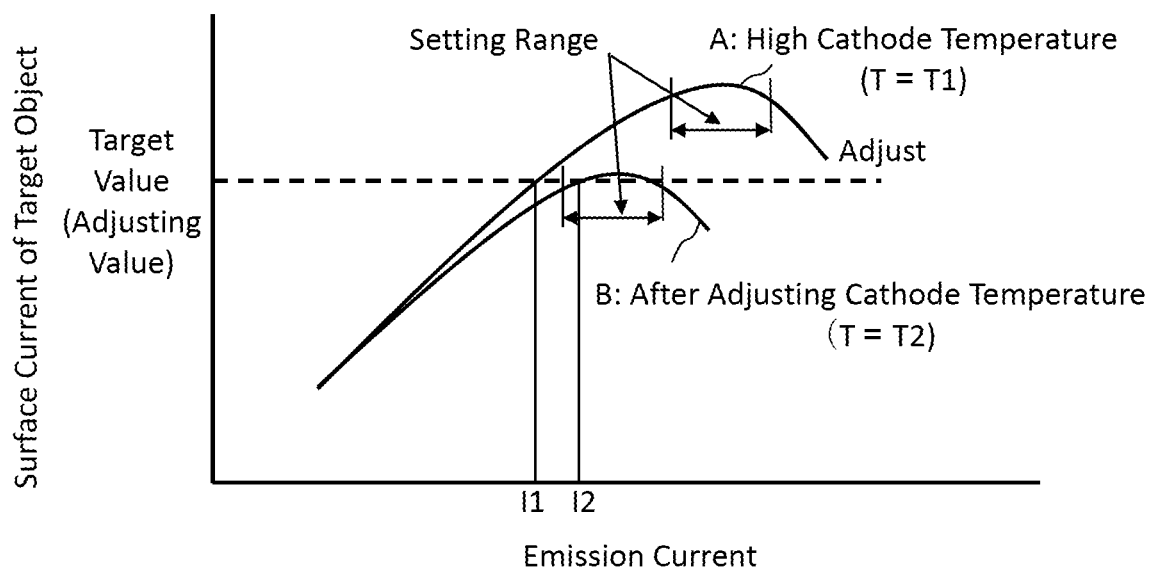
FIG. 9 shows an example of a relation between a gradient and a setting range according to the first embodiment.

FIG. 9 shows an example of a relation between a gradient and a setting range according to the first embodiment. In FIG. 9, in the case of the cathode temperature T=T1, as shown in the graph A, the emission current value I1 which gives a preset luminance is out of the setting range. In that state, the gradient value at the emission current value I1 is not in the range of the gradient values in the characteristic setting range shown in FIG. 8B. Therefore, the determination unit 68 determines that the gradient value at the emission current value I1 is not in the range of the gradient values in the characteristic setting range. On the other hand, in the case of the cathode temperature T=T2, as shown in the graph B, the emission current value I2 which gives a preset luminance is within the setting range. In that state, the gradient value at the emission current value I2 is in the range of the gradient values in the characteristic setting range shown in FIG. 8B. Therefore, the determination unit 68 determines that the gradient value at the emission current value I2 is in the range of the gradient values in the characteristic setting range.

If the gradient value is determined not to be in the range of the gradient values in the characteristic setting range, since the cathode temperature T is too high as shown in FIG. 9, it proceeds to the cathode temperature reducing processing step (S120). If the gradient value is determined to be in the range of the gradient values in the characteristic setting range, the cathode temperature T has been adjusted to acquire a characteristic close to an ideal state characteristic. Therefore, it is determined that adjustment of the cathode temperature T has been completed, and thus, adjustment of the operating conditions of the electron gun 201 may be finished. However, according to the first embodiment, in order to explore the possibility of further reducing the cathode temperature T, it proceeds to the determining step (S130).

In the cathode temperature reducing processing step (S120), the T control unit 76 controls the filament power supply circuit 231 to reduce the cathode temperature T by one step. The filament power supply circuit 231 supplies a filament power W for reducing the cathode temperature T by one step. The change range (width) per step of the cathode temperature T may be the same as the one for increasing it by one step. For example, it is preferable to set the change range of the cathode temperature T in the range between 5 degrees C. and 50 degrees C. For example, it is set to be 10 degrees C.

In the beam adjusting step (S122), the electron beam 200 emitted from the electron gun 201 at a set cathode temperature is adjusted so that the electron beam 200 may satisfy predetermined conditions. The contents of the beam adjusting step (S122) are the same as those of the beam adjusting step (S104). When the beam adjusting step (S122) is carried out, since the cathode temperature T is too high, the luminance does not become insufficient. Thereby, the emission current can be adjusted to acquire a preset luminance. Then, it returns to the characteristic measuring step (S112), and each step from the characteristic measuring step (S112) to the beam adjusting step (S122) is repeated until the gradient value which is in a beam adjustment state determined to be capable of acquiring a preset luminance is determined, in the determining step (S118), to be in the range of the gradient values in the characteristic setting range.

In the determining step (S130), the determination unit 69 determines whether the value of a flag is zero or not. If the value of a flag is not zero, it turns out that adjustment has been performed to increase the cathode temperature T from the state where the initial value of the cathode temperature T was too low. On the contrary, if the value of a flag is zero, it turns out that adjustment has been performed to reduce the cathode temperature T from the state where the initial value of the cathode temperature T was too high. When the value of a flag is not zero, the cathode temperature T has been adjusted to obtain an ideal state characteristic or an approximately ideal state characteristic in a range to acquire a required luminance. Therefore, it is determined that adjustment of the cathode temperature T has been completed, and it proceeds to the writing step (S150). On the other hand, when the value of a flag is zero, since there may be a possibility of further reducing the cathode temperature T, it proceeds to the cathode temperature reducing processing step (S132).

In the cathode temperature reducing processing step (S132), the T control unit 76 controls the filament power supply circuit 231 to reduce the cathode temperature T by one step. The contents of the cathode temperature reducing processing step (S132) are the same as those of the cathode temperature reducing processing step (S120).

In the beam adjusting step (S134), the electron beam 200 emitted from the electron gun 201 at a set cathode temperature is adjusted such that the electron beam 200 satisfies predetermined conditions. The contents of the beam adjusting step (S134) are the same as those of the beam adjusting step (S104).

In the determining step (S136), the determination unit 66 determines whether a preset luminance can be obtained at a set cathode temperature. The contents of the determining step (S136) are the same as those of the determining step (S106). When it is determined that a preset luminance can be obtained at a set cathode temperature, since there may be a possibility of further reducing the cathode temperature T, it returns to the characteristic measuring step (S112). Then, each step from the characteristic measuring step (S112) to the determining step (S136) is repeated until it is determined in the determining step (S136) that a preset luminance cannot be obtained at a set cathode temperature.

On the contrary, when it is determined that a preset luminance cannot be obtained at a set cathode temperature, since the cathode temperature has been reduced too low, it proceeds to the cathode temperature increasing processing step (S138) in order to return to the state where luminance is obtained.

In the cathode temperature increasing processing step (S138), the T control unit 76 controls the filament power supply circuit 231 to increase the cathode temperature T by one step. The contents of the cathode temperature increasing processing step (S138) are the same as those of the cathode temperature increasing processing step (S108). Thus, according to the first embodiment, when adjusting the cathode temperature to be in the range of the gradient values in the characteristic setting range, after reducing the cathode temperature, processing is performed to increase it. That is, after having a state where a preset luminance cannot be obtained because the cathode temperature was reduced, it becomes possible to return to the range, where beam adjustment can be performed to acquire a preset luminance, by increasing the cathode temperature T by one step. Along with this, it is possible to let a gradient value be in the range of the gradient values in the characteristic setting range.

In the beam adjusting step (S140), the electron beam 200 emitted from the electron gun 201 at a set cathode temperature is adjusted such that the electron beam 200 satisfies predetermined conditions. The contents of the beam adjusting step (S140) are the same as those of the beam adjusting step (S104). Since the state obtained by increasing the cathode temperature T by one step has already been beam-adjusted in the beam adjusting step (S134), the present state can be obtained by returning to the past state where beam-adjustment had been performed.

Thereby, the cathode temperature T can be further reduced in the state where beam adjustment to acquire a preset luminance can be performed, and the gradient value is within the range of the gradient value (distribution) of the characteristic setting range. In other words, as shown in the characteristic graph B of FIG. 9, adjustment can be performed to obtain the cathode temperature T (e.g., T=T2) in which the gradient value is in the range of the gradient values in the characteristic setting range, and an approximately ideal state characteristic can be acquired. Thus, it is determined that adjustment of the cathode temperature T has been completed, and it proceeds to the writing step (S150).

In the writing step (S150), the writing data processing unit 56 reads writing data stored in the storage device 140, and generates writing time data to perform writing with multiple beams. The writing control unit 58 rearranges irradiation time data in the order of shot in accordance with the writing sequence. Then, the irradiation time data is transmitted to the deflection control circuit 130 in the order of shot. The deflection control circuit 130 outputs deflection control signals to the DAC amplifier units 132 and 134 in the order of shot while outputting a blanking control signal to the blanking aperture array mechanism 204 in the order of shot. The writing mechanism 150 controlled by the writing control unit 58 writes a pattern on the target object 101, using an electron beam where the cathode temperature T has been adjusted to make the gradient value be in the range of the gradient value of the setting range (predetermined range).

Figure 10:
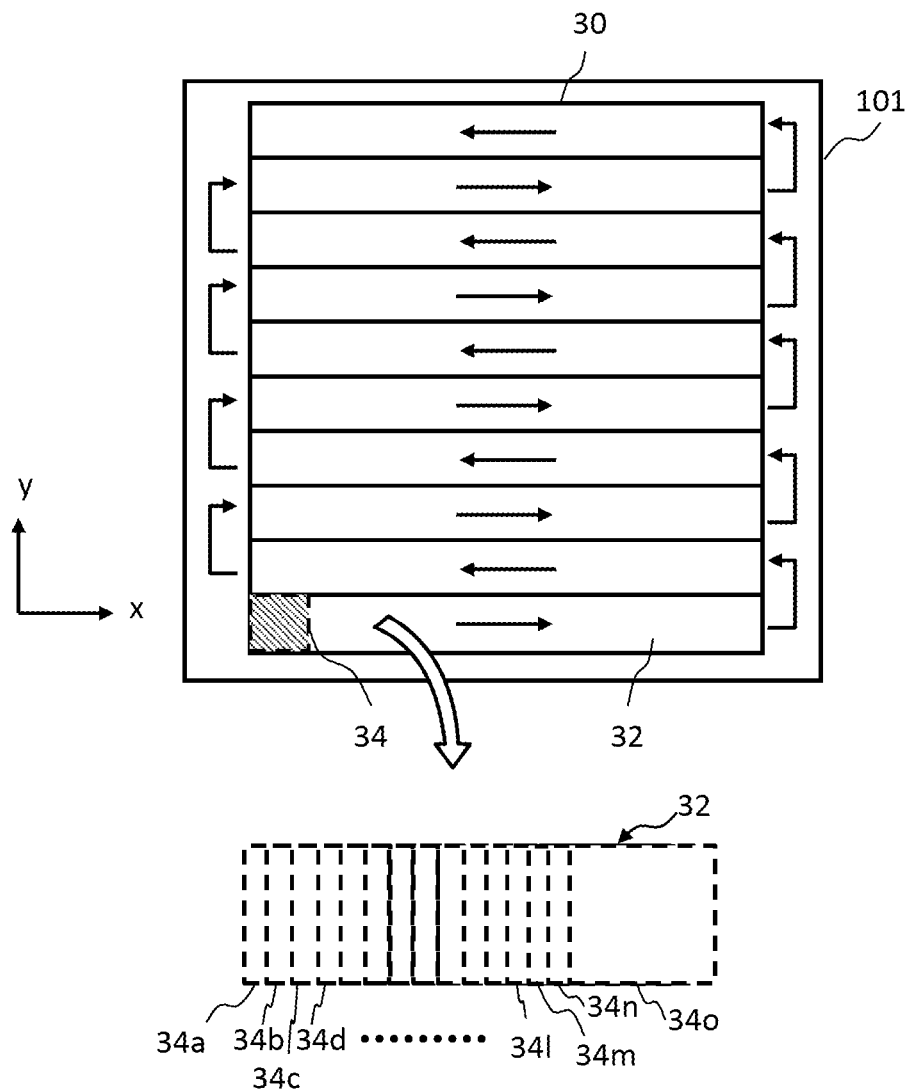
FIG. 10 is a conceptual diagram illustrating an example of a writing operation according to the first embodiment.

FIG. 10 is a conceptual diagram illustrating an example of a writing operation according to the first embodiment. As shown in FIG. 10, a writing region 30 of the target object 101 is virtually divided, for example, by a predetermined width in the y direction into a plurality of stripe regions 32 in a strip form. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of the holes 22 are formed at a time by one shot of multiple beams having been formed by passing through the holes 22 in the shaping aperture array substrate 203. Further, although FIG. 10 shows the case where writing is performed once for each stripe region 32, it is not limited thereto. It is also preferable to perform multiple writing which writes the same region multiple times. In performing the multiple writing, preferably, the stripe region 32 of each pass is set while shifting the position.

Figure 11:
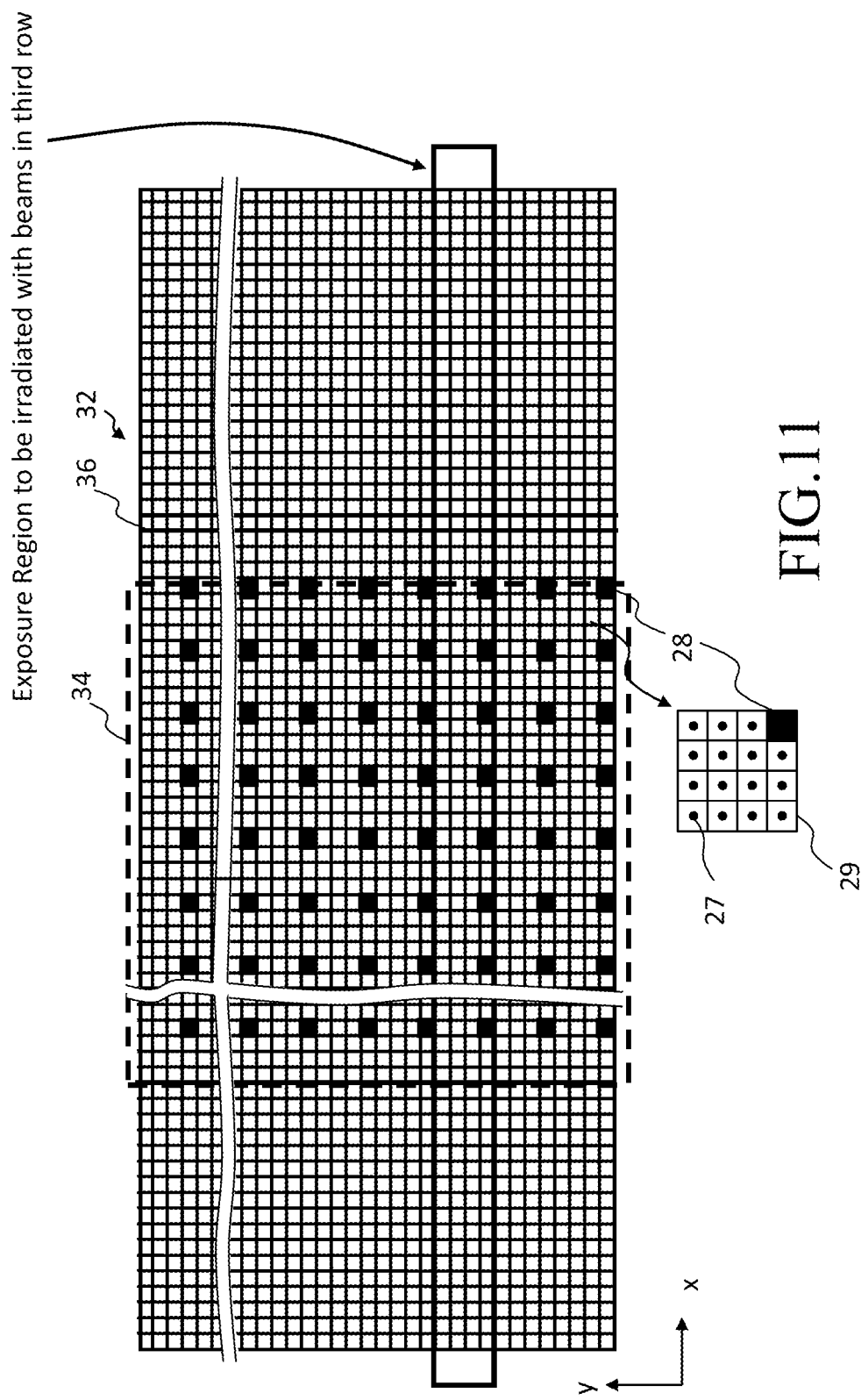
FIG. 11 shows an example of an irradiation region of multiple beams and a writing target pixel according to the first embodiment.

FIG. 11 shows an example of an irradiation region of multiple beams and a pixel to be written (writing target pixel) according to the first embodiment. In FIG. 11, in the stripe region 32, there are set a plurality of control grids 27 (design grids) arranged in a grid form at the beam size pitch of the multiple beams 20 on the surface of the target object 101, for example. Preferably, they are arranged at a pitch of around 10 nm. The plurality of control grids 27 serve as design irradiation positions of the multiple beams 20. The arrangement pitch of the control grid 27 is not limited to the beam size, and may be an optional size which can be controlled as a deflection position of the deflector 209, regardless of the beam size. Then, a plurality of pixels 36 obtained by virtually dividing into a mesh form by the same size as that of the arrangement pitch of the control grid 27 are set, each of which is centering on each control grid 27. Each pixel 36 serves as an irradiation unit region per beam of the multiple beams. FIG. 11 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple beams 20. The x-direction size of the irradiation region 34 can be defined by the value obtained by multiplying the beam pitch (pitch between beams) in the x direction of the multiple beams 20 by the number of beams in the x direction. The y-direction size of the irradiation region 34 can be defined by the value obtained by multiplying the beam pitch in the y direction of the multiple beams 20 by the number of beams in the y direction. The width of the stripe region 32 is not limited to this. Preferably, the width of the stripe region 32 is n times (n being an integer of one or more) the size of the irradiation region 34. FIG. 11 shows the case where the multiple beams of 512×512 (rows×columns) are simplified to 8×8 (rows× columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 11, one sub-irradiation region 29 is a region surrounded by beam pitches. In the case of FIG. 11, each sub-irradiation region 29 is composed of 4×4 pixels.

Figure 12:
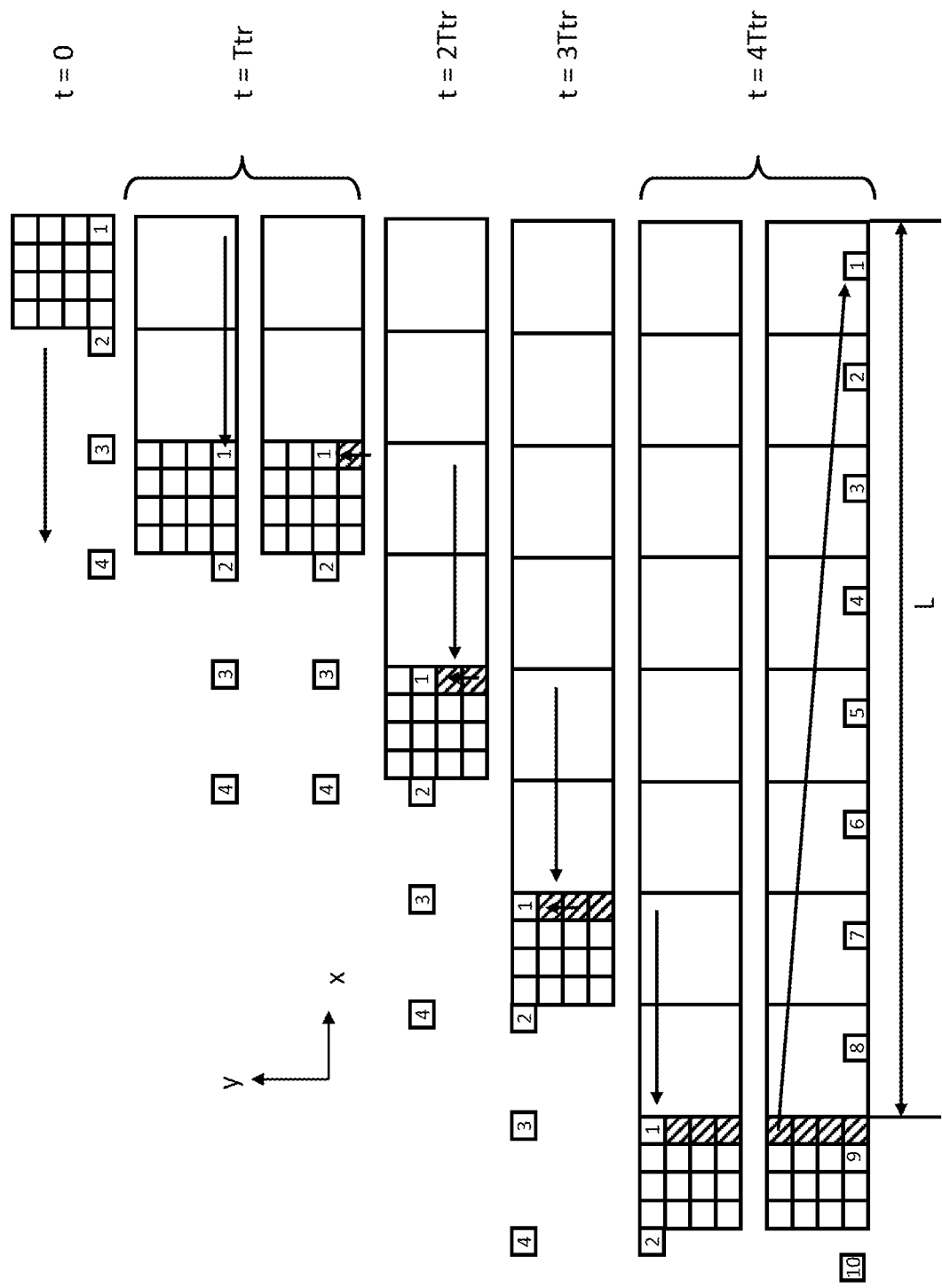
FIG. 12 illustrates an example of a writing method of multiple beams according to the first embodiment.

FIG. 12 illustrates an example of a writing method of multiple beams according to the first embodiment. FIG. 12 shows a portion of the sub-irradiation region 29 to be written by each of beams at the coordinates (1, 3), (2, 3), (3, 3), . . . , (512, 3) in the third row from the bottom in the multiple beams for writing the stripe region 32 shown in FIG. 11. In the example of FIG. 12, while the XY stage 105 moves the distance of eight beam pitches, four pixels are written (exposed), for example. In order that the relative position between the irradiation region 34 and the target object 101 may not be shifted by the movement of the XY stage 105 while these four pixels are written (exposed), the irradiation region 34 is made to follow the movement of the XY stage 105 by collective deflection of all of the multiple beams 20 by the deflector 208. In other words, tracking control is performed. In the case of FIG. 12, one tracking cycle is executed by writing (exposing) four pixels while shifting, per shot, the irradiation target pixel 36 in the y direction during a movement by the distance of eight beam pitches.

Specifically, the writing mechanism 150 irradiates each control grid 27 with a corresponding beam in an ON state in the multiple beams 20 during a writing time (irradiation time or exposure time) corresponding to each control grid 27 within a maximum irradiation time Ttr of the irradiation time of each of the multiple beams of the shot concerned. The maximum irradiation time Ttr is set in advance. Although the time obtained by adding a settling time of beam deflection to the maximum irradiation time Ttr actually serves as a shot cycle, the settling time of beam deflection is here omitted to indicate the maximum irradiation time Ttr as the shot cycle. After one tracking cycle is completed, the tracking control is reset so as to swing back (return) the tracking position to the starting position of a next tracking cycle.

Since writing of the pixels in the first column from the right of each sub-irradiation region 29 has been completed, the deflector 209 performs deflection, after resetting the tracking, in a next tracking cycle, such that the writing position of each corresponding beam is adjusted (shifted) to the control grid 27 of the pixel at the bottom row in the second column from the right of each sub-irradiation region 29.

As described above, in the state where the relative position of the irradiation region 34 to the target object 101 is controlled by the deflector 208 to be the same (unchanged) position during the same tracking cycle, each shot is carried out while performing shifting from a control grid 27 (a pixel 36) to another control grid 27 (another pixel 36) by the deflector 209. Then, after finishing one tracking cycle and returning the tracking position of the irradiation region 34, the first shot position is adjusted to the position shifted by, for example, one control grid (one pixel) as shown in the lower part of FIG. 10, and each shot is performed shifting from one control grid (one pixel) to another control grid (another pixel) by the deflector 209 while executing a next tracking control. By repeating this operation during writing the stripe region 32, the position of the irradiation region 34 is shifted consecutively, such as from 34*a* to 34*o*, to perform writing of the stripe region concerned.

Based on the writing sequence, it is determined which beam of the multiple beams irradiates which control grid 27 (pixel 36) on the target object 101. Supposing that the sub-irradiation region 29 is a region composed of n×n pixels, n control grids (n pixels) are written by one tracking operation. Then, by the next tracking operation, other n pixels in the same n×n pixel region are similarly written by a different beam from the one used above. Thus, writing is performed for each n pixels by a different beam each time in n-time tracking operations, thereby writing all of the pixels in one region of n×n pixels. With respect also to other sub-irradiation regions 29 each composed of n×n pixels in the irradiation region of multiple beams, the same operation is executed at the same time so as to perform writing similarly.

Regarding the cathode 222, it has a possibility of degradation (evaporation) advancement during writing. With degradation of the cathode 222, the characteristic between the surface current of the target object and the emission current changes. Therefore, in the electron gun 201, the emission current is continuously adjusted so that a required luminance can be obtained at a set cathode temperature. Accordingly, the gradient value being used may be out of the range of the gradient value of the characteristic setting range. Consequently, there is a possibility that the electron gun 201 operates at the cathode temperature T higher than needed. Then, according to the first embodiment, the cathode temperature T is examined during writing whether it is appropriate or not, which is specifically described below.

Figure 13:
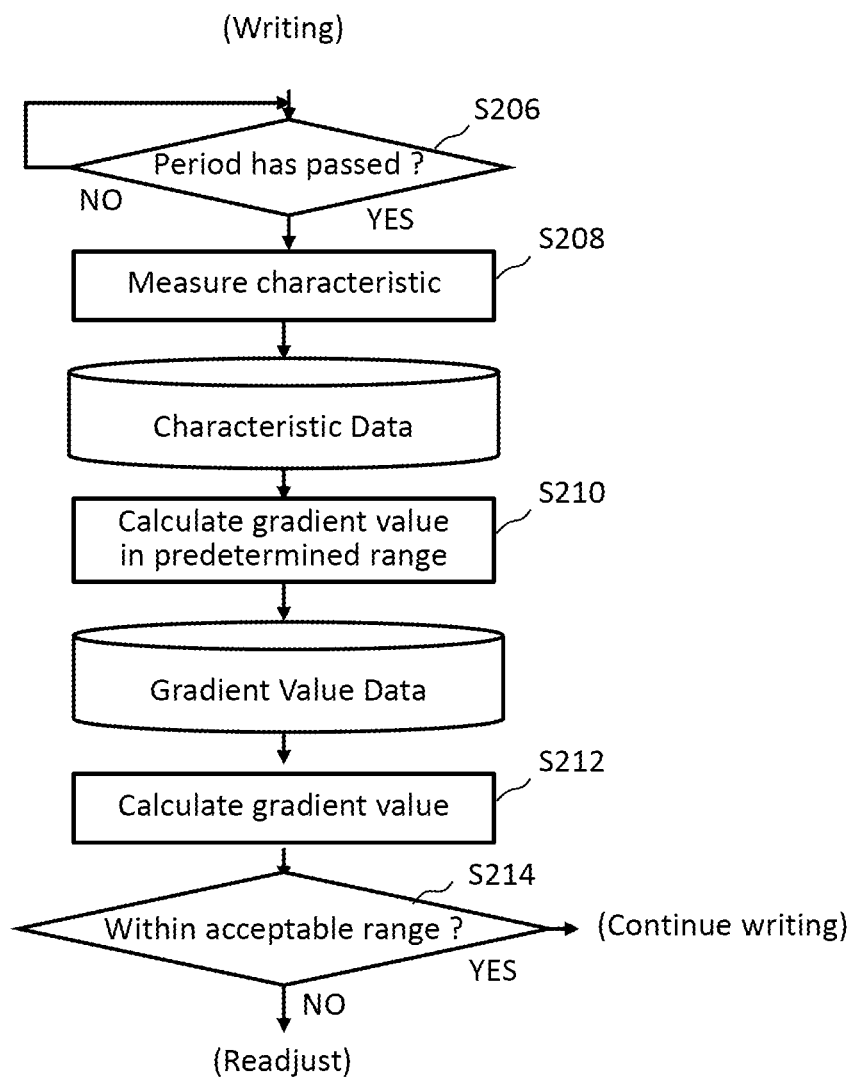
FIG. 13 shows an example of a method for controlling operations of an electron gun after starting writing according to the first embodiment.

FIG. 13 shows an example of a method for controlling operations of an electron gun after starting writing according to the first embodiment. In FIG. 13, the method for controlling operations of an electron gun after starting writing according to the first embodiment executes a series of steps: a determining step (S206), a characteristic measuring step (S208), a gradient value calculating step (S210), a gradient value calculating step (S212), and a determining step (S214).

In the determining step (S206), the writing control unit 58 determines whether a predetermined time period has passed since writing started. If the predetermined time period has not passed yet, the determining step (S206) is repeated until it has passed.

In the characteristic measuring step (S208), the characteristic acquisition unit 60 acquires, for each predetermined time period, a characteristic between the emission current and the surface current of the target object at the position on the target object surface irradiated with an electron beam while changing the emission current of the electron beam. The contents of the characteristic measuring step (S208) are the same as those of the characteristic measuring step (S112). Acquired characteristic data is stored in the storage device 79.

In the gradient value calculating step (S210), based on the characteristic acquired in the characteristic measuring step (S208), the gradient value calculation unit 62 calculates, for each predetermined time period, gradient values each obtained by dividing the surface current of the target object by the emission current in the setting range of the emission current in the characteristic. The contents of the gradient value in predetermined range calculating step (S210) are the same as those of the gradient value in predetermined range calculating step (S114). Data of the calculated gradient value is stored in the storage device 79.

In the gradient value calculating step (S212), the gradient value calculation unit 64 calculates, for each predetermined time period, a gradient value by dividing the surface current of the target object, in the state where the electron beam 200 has been adjusted so that a preset luminance can be acquired at a set cathode temperature, by the emission current. The contents of the gradient value calculating step (S212) are the same as those of the gradient value calculating step (S116).

In the determining step (S214), the determination unit 68 determines, for each predetermined time period, whether the gradient value in a beam adjustment state having been determined that a preset luminance can be obtained is in the range of the gradient values in the characteristic setting range.

As a result of the determination, when the gradient value is in the range of the gradient values in the characteristic setting range, the writing processing is continued. On the other hand, when the gradient value is out of the range of the gradient value of the characteristic setting range, the cathode temperature is again adjusted so that the gradient value may be in the range of the gradient values in the characteristic setting range. The method for readjustment is the same as that of the flowchart of FIG. 5.

As described above, the state of the cathode temperature T becoming too high during writing can be prevented or reduced by updating the cathode temperature T during the writing.

As described above, according to the first embodiment, the cathode temperature T can be made low while electron beams emitted from the electron gun 201 maintain a required luminance.

Embodiments have been explained referring to specific examples described above. However, the present invention is not limited to these specific examples.

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

In addition, any other method for controlling operations of an electron emission source, electron beam writing method, and electron beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for controlling operation of an electron emission source comprising:
   emitting an electron beam;
   adjusting the electron beam so that a desired current is obtained on a surface of a target object;
   acquiring, while varying an emission current of the electron beam, a characteristic between a surface current of the target object at a position on the surface of the target object irradiated with the electron beam, and the emission current;
   calculating, based on the characteristic, first gradient values each obtained by dividing the surface current of the target object by the emission current, in a predetermined range of the emission current in the characteristic;
   calculating a second gradient value by dividing a surface current of the target object by an emission current in a state where the electron beam has been adjusted; and
   adjusting a cathode temperature to make the second gradient value in the state where the electron beam has been adjusted be in a range of the first gradient values in the predetermined range of the emission current.

2. The method according to claim 1, wherein the predetermined range includes a peak position of the characteristic.

3. The method according to claim 1, wherein the acquiring the characteristic, the calculating the first gradient values in the predetermined range of the emission current, and the calculating the second gradient value in the state where the electron beam has been adjusted to acquire the desired current, are executed for each predetermined time period, further comprising:
   determining, for the each predetermined time period, whether the second gradient value is in the range of the first gradient values in the predetermined range of the emission current; and
   readjusting the cathode temperature to make the second gradient value be in the range of the first gradient values in the predetermined range of the emission current in a case where, as a result of the determining, the second gradient value is out of the range of the first gradient values in the predetermined range of the emission current.

4. The method according to claim 3, wherein the readjusting the cathode temperature to make the second gradient value be in the range of the first gradient values in the predetermined range of the emission current includes reducing the cathode temperature.

5. The method according to claim 3, wherein the readjusting the cathode temperature to make the second gradient value be in the range of the first gradient values in the predetermined range of the emission current includes determining whether a preset luminance is obtained at a set cathode temperature.

6. The method according to claim 5, wherein the readjusting the cathode temperature to make the second gradient value be in the range of the first gradient values in the predetermined range of the emission current further includes increasing the cathode temperature in a case where the preset luminance is not obtained.

7. The method according to claim 1, wherein the adjusting the cathode temperature to make the second gradient value be in the range of the first gradient values in the predetermined range of the emission current includes
   reducing the cathode temperature, and
   increasing the cathode temperature after reducing it.

8. The method according to claim 7, further comprising:
   determining, after the reducing the cathode temperature, whether a preset luminance is obtained at a set cathode temperature.

9. An electron beam writing method comprising:
   emitting an electron beam;
   adjusting the electron beam so that a desired current is obtained on a surface of a target object;
   acquiring, while varying an emission current of the electron beam, a characteristic between a surface current of the target object at a position on the surface of the target object irradiated with the electron beam, and the emission current;
   calculating, based on the characteristic, first gradient values each obtained by dividing the surface current of the target object by the emission current, in a predetermined range of the emission current in the characteristic;
   calculating a second gradient value by dividing a surface current of the target object by an emission current in a state where the electron beam has been adjusted;
   adjusting a cathode temperature to make the second gradient value in the state where the electron beam has been adjusted be in a range of the first gradient values in the predetermined range of the emission current; and writing a pattern on the target object, using an electron beam in a state where the cathode temperature has been adjusted to make the second gradient value be in the range of the first gradient values in the predetermined range of the emission current.

10. An electron beam writing apparatus comprising:

an electron emission source configured to emit an electron beam;

an emission current control circuit configured to control an emission current of the electron beam emitted from the electron emission source;

an acquisition circuit configured to acquire a characteristic between a surface current of a target object at a position on a surface of the target object irradiated with the electron beam, and the emission current of the electron beam;

a first gradient value calculation circuit configured to calculate, based on the characteristic, first gradient values each obtained by dividing the surface current of the target object by the emission current in a predetermined range of the emission current in the characteristic;

a second gradient value calculation circuit configured to calculate a second gradient value by dividing a surface current of the target object by an emission current in a state where the electron beam has been adjusted to acquire a desired current on the surface of the target object;

a temperature adjustment circuit configured to adjust a cathode temperature to make the second gradient value in the state where the electron beam has been adjusted be in a range of the first gradient values in the predetermined range of the emission current; and a writing mechanism configured to write a pattern on the target object, using an electron beam in a state where the cathode temperature has been adjusted to make the second gradient value be in the range of the first gradient values in the predetermined range of the emission current.

* * * * *